United States Patent
Narasimhan et al.

(10) Patent No.: US 6,277,253 B1
(45) Date of Patent: Aug. 21, 2001

(54) EXTERNAL COATING OF TUNGSTEN OR TANTALUM OR OTHER REFRACTORY METAL ON IMP COILS

(75) Inventors: Murali Narasimhan; Xiangbing Li, both of San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/414,651

(22) Filed: Oct. 6, 1999

(51) Int. Cl.$^7$ ............................. C23C 14/34; C23C 14/42

(52) U.S. Cl. ........................... 204/298.06; 204/298.08; 204/298.12; 204/298.13; 204/298.02; 204/298.15; 336/90; 336/73; 336/180; 336/185; 336/192; 336/212; 336/221; 427/446; 427/454; 427/455; 427/456; 427/585; 427/580; 427/523; 427/528; 427/531; 205/80; 205/149; 205/151; 205/170; 205/181

(58) Field of Search ............... 204/298.06, 298.08, 204/298.12, 298.13, 298.02, 298.15; 118/723 E, 723 ER, 723 I, 723 IR, 728; 336/90, 73, 180, 185, 192, 212, 221; 427/446, 454, 455, 456, 585, 580, 523, 528, 531; 205/80, 149, 151, 170, 181

(56) References Cited

U.S. PATENT DOCUMENTS

| | | | |
|---|---|---|---|
| 3,669,871 | * 6/1972 | Elmgren et al. | 204/298.12 |
| 4,016,389 | 4/1977 | White . | |
| 4,476,000 | * 10/1984 | Nagao et al. | 204/192.2 |
| 5,178,739 | 1/1993 | Barnes et al. | 204/192.12 |
| 5,358,615 | 10/1994 | Grant et al. | 204/192.15 |
| 5,707,498 | * 1/1998 | Ngan | 204/192.12 |
| 5,747,118 | 5/1998 | Bunshah et al. | 427/577 |
| 5,853,816 | * 12/1998 | Vanderstraeten | 204/298.13 |
| 5,904,562 | 5/1999 | Nulman | 438/654 |

FOREIGN PATENT DOCUMENTS

| | | | |
|---|---|---|---|
| 590904 | * | 4/1994 | (EP) . |
| 64-66981 | * | 3/1989 | (JP) . |
| 6-228746 | * | 8/1994 | (JP) . |
| WO 95/08438 | * | 3/1995 | (WO) . |
| 97/42648 | | 11/1997 | (WO) . |

OTHER PUBLICATIONS

Awaya, et al. "Evaluation of a copper metallization process and its effect on the electrical characteristics of copper–interconnected quarter–micron CMOS," VMIC Conference, Santa Clara, CA—104/95/0017; pp. 17–23, Jun. 1995.

Fu, et al. "Single chamber in–situ coherent–PVD TiN barrier for Al planarization applications," VMIC Conference, Santa Clara, CA—104/95/0198; pp. 198–200, Jun. 1995.

Narasimhan, et al. "Single chamber in–situ PVD TiN barrier for Al metallization applications," VMIC Conference, Santa Clara, CA—104/95/0210; pp. 210–213, Jun. 1995.

Lee et al., eds. *ASM Handbook, vol. 7: Powder Metal Technologies and Applications.* ASM International, 1998; selected sections. (Month unknown).

Groover, Mikell P. "Fundamentals of Modern Manufacturing: Materials, Processes, and Systems," Prentice–Hall, 1996; pp. 822–834 and 862, (Month unknown).

(List continued on next page.)

*Primary Examiner*—Alan Diamond
(74) *Attorney, Agent, or Firm*—Konrad, Raynes & Victor

(57) ABSTRACT

Embodiments include a method for depositing material onto a workpiece in a sputtering chamber. The method includes sputtering a target and a coil in said sputtering chamber. The coil may have a preformed multilayer structure formed outside of the sputtering chamber. The outer layer of the coil may act as a secondary source of deposition material. The multilayer structure may be formed with an inner region or a base metal and an outer layer of a sputtering metal. The outer layer may be formed using a process such as plasma spraying, arc spraying, flame spraying, ion plating, chemical vapor deposition and electroplating.

40 Claims, 6 Drawing Sheets

OTHER PUBLICATIONS

Tucker, Robert C. "Thermal Spray Coatings," in *ASM Handbook, vol. 5: Surface Engineering.* Henry, et al., eds. ASM International, 1994; pp. 497–509, (Month unknown).

Wang, et al. "Correlation of PVD–TiN materials properties to barrier and device performance in Al–fill technologies," VMIC Conference, Santa Clara, CA—104/95/0204; pp. 204–206, Jun. 1995.

U.S. application No. 08/853,024 filed May 8, 1997 (atty docket 1186.P1).

European Patent Office Examination Report mailed Sep. 12, 1997, in Application No. PCT/US/97/08008 (attached to 97/42648).

U.S. application No. 08/647,182, filed May 9, 1996.

U.S. application No. 08/853,024, filed May 8, 1997.

* cited by examiner

EXTERNAL COATING OF TUNGSTEN OR TANTALUM OR OTHER REFRACTORY METAL ON IMP COILS

FIELD OF THE INVENTION

The present invention relates to sputtering, and more particularly, to methods and devices used in a sputtering process such as depositing a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target towards the substrate, at angles which are usually oblique to the surface of the substrate. As a consequence, materials deposited in etched openings, including trenches and holes of semiconductor devices having openings with a high depth to width aspect ratio, may not adequately coat the walls of the openings, particularly the bottom walls. If a large amount of material is being deposited, the deposited material can bridge over the opening, causing undesirable cavities in the deposition layer. To prevent such cavities, sputtered material can be redirected into more vertical paths between the target and the substrate by negatively biasing (or self-biasing) the substrate and positioning appropriate vertically oriented electric fields adjacent the substrate if the sputtered material is sufficiently ionized by the plasma. However, material sputtered by a low density plasma often has an ionization degree of less than 10 percent, which is usually insufficient to avoid the formation of an excessive number of cavities. Accordingly, it is desirable to increase the density of the plasma to increase the ionization rate of the sputtered material in order to decrease the formation of cavities in the deposition layer. As used herein, the term "dense plasma" is intended to refer to one that has a high electron and ion density, typically in the range of $10^{11}$–$10^{13}$ ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces currents in the plasma. These currents heat the conducting plasma so that it is sustained in a steady state. As shown in U.S. Pat. No. 4,362,632, for example, current through a coil is supplied by an RF generator coupled to the coil through an impedance-matching network, such that the coil acts as the first windings of a transformer. The plasma acts as a single turn second winding of a transformer.

Although ionizing the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniform deposition thickness is needed.

As described in copending application Ser. No. 08/680,335, entitled "Coils for Generating a Plasma and for Sputtering," filed Jul. 10, 1996 and assigned to the assignee of the present application, it has been recognized that the coil itself may provide a source of sputtered material to supplement the deposition material sputtered from the primary target of the chamber. Application of an RF signal to the coil can cause the coil to develop a negative bias, which attracts positive ions to impact the coil and sputter material from the coil. Because the material sputtered from the coil tends to deposit more thickly at the periphery of the wafer, the center thick tendency for material sputtered from the primary target can be compensated by the edge thick tendency for material sputtered from the coil. As a result, uniformity can be improved when sputtering from a target and coil fabricated from materials such as aluminum and titanium.

Materials other than aluminum and titanium are sometimes deposited as part of interconnect structures. For example, a tungsten plug may be used to connect different layers in a device. In addition, wiring lines often utilize barrier or adhesion films between the wiring line and the underlying layer. Certain high melting point metals such as tungsten and tantalum are sometimes used as barrier films. These metals tend to be more brittle than aluminum and titanium. As a result, it may be difficult or prohibitively expensive to manufacture complicated or large structures from these high melting point metals.

U.S. Pat. No. 5,178,739 notes the problem of contamination due to material flaking off of a coil during sputtering and becoming deposited on the workpiece. The '739 patent proposes to fabricate the coil out of, or coat it with, the material being deposited. The '739 patent does not offer any method of creating such a coating, however. U.S. Pat. No. 5,707,498 recognizes the same problem, and proposes a pasting step to coat a coil with the material being sputtered. Such a pasting step is performed to coat the coil with the target material prior to sputtering the target material onto the workpiece. In one example, the pasting step may be accomplished by sputtering a titanium target prior to inserting the workpiece into the chamber. The pasting process, however, deposits a layer on the coil in a relatively slow manner, and depending on the thickness desired, a significant amount of time may be required to form the layer. The additional time and process step required for carrying out such a pasting step undesirably lowers the system throughput.

SUMMARY OF THE PREFERRED EMBODIMENTS

Certain embodiments of the present invention are directed towards an apparatus and a method which includes a target and a preformed, multilayer coil within a vacuum chamber for sputtering material onto a workpiece. The target includes a first metal for sputtering onto the workpiece. The coil radiates energy into the plasma generation area in the chamber. The preformed, multilayer structure of the coil includes an outer layer of the first metal and an inner region of a second metal. The outer layer acts as a source of sputtering material. By sputtering the coil as a secondary source in addition to the target, a more uniform deposition onto the workpiece may be achieved.

One embodiment relates to a method for forming a coil having a sputtering surface. A coil having an inner core of a first metal material is provided, and an outer layer of a second metal material having a sputtering surface is formed using plasma spraying, arc spraying, flame spraying, ion plating, chemical vapor deposition or electroplating. These methods can be used to form a coating of a metal such as a refractory metal over a base metal coil at a low cost when compared to forming a coil by machining a block of the refractory metal, for example. These methods permit a thick film to be formed. The coil is generally considered a consumable part in a sputtering system. As a result, a thick film capable of being sputtered many times is preferred.

Other embodiments relate to methods for fabricating a component for use in a plasma sputtering chamber. A base metal part is provided, and an intermediate layer is formed over the base metal part. An outer sputtering layer is then formed over the intermediate layer. Components which may be formed include, but are not limited to, targets, coils and coil standoffs.

Other embodiments relate to a coil for use in a plasma processing system. The coil includes an outer layer of a first metal material, an inner region of a second metal material, and an intermediate layer between the outer layer and the inner region. The first metal material and said second metal material have different compositions.

Still other embodiments relate to an apparatus for sputtering material onto a workpiece, including a target having a first metal adapted to be sputtered onto the workpiece, a holder for the workpiece, and a plasma generation area between the target and the holder. A coil is positioned and adapted to radiate energy into the plasma generation area and to sputter material onto the workpiece. The coil has a preformed multilayer structure including an outer layer of the first metal and an inner region of a second metal. The outer layer of the coil is a layer such as an arc sprayed layer, a flame sprayed layer, a plasma sprayed layer, an ion plated layer, a chemical vapor deposited layer, or an electroplated layer.

Other embodiments relate to a semiconductor fabrication system including a target including a first metal sputtering surface provided in a sputtering chamber. At least one preformed multilayer structure is provided in said chamber, the preformed multilayer structure having a base layer, an intermediate layer and an outer layer over the intermediate layer. The outer layer is the same material as the first metal.

BRIEF DESCRIPTION OF THE DRAWINGS

Embodiments of the invention are described with reference to the accompanying drawings which, for illustrative purposes, are schematic and not drawn to scale.

DETAILED DESCRIPTION

Figure 1:
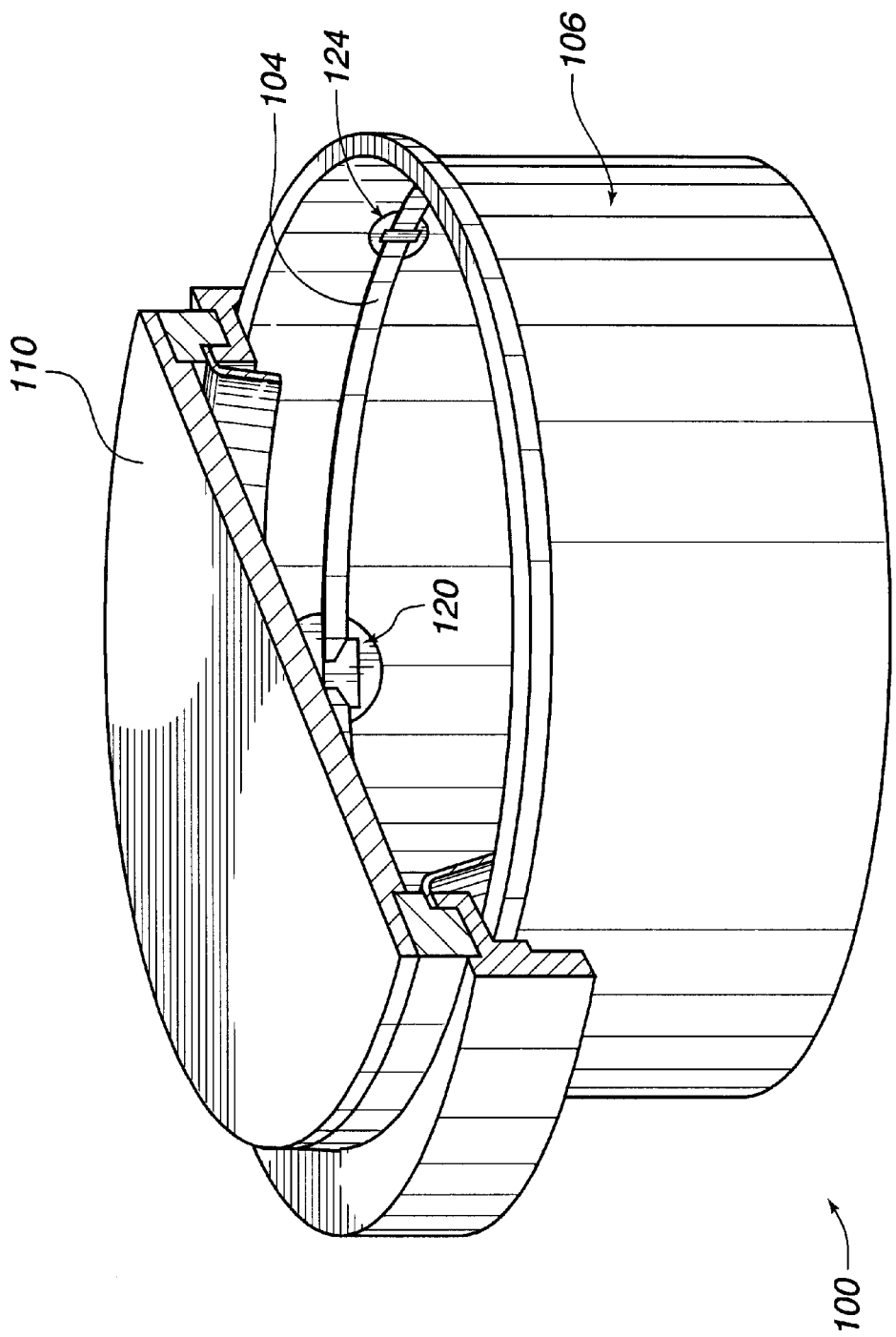
FIG. 1 is a perspective, partial cross-sectional view of a plasma generating chamber for sputter depositing a layer in a manner in accordance with an embodiment of the present invention.

When sputtering metal layers in a system in which the sputtered material is ionized to fill high aspect ratio features on the workpiece surface, many sputtered contact metals have a tendency to deposit more thickly in the center of the wafer as compared to the edges. As described in aforementioned copending application Ser. No. 08/680,335, entitled "Coils for Generating a Plasma and for Sputtering," filed Jul. 10, 1996, the coil itself may provide a source of sputtered material to supplement the deposition material sputtered from the primary target of the chamber. Application of an RF signal to the coil can cause the coil to develop a negative bias and attract positive ions to impact the coil and cause material to be sputtered from the coil. Because the material sputtered from the coil tends to deposit more thickly at the periphery of the wafer, the center thick tendency for material sputtered from the primary target can be compensated by the edge thick tendency for material sputtered from the coil. As a result, uniformity can be improved by forming both the target and coil from the same metal.

Metals used in interconnection schemes for which both targets and coils may be relatively easily formed include aluminum and titanium. Many other metals are used in interconnection structures. For example, a tungsten plug may be used to connect different layers in a device. In addition, barrier or adhesion films are deposited between a metal layer and an underlying layer for a variety of reasons, including improved adhesion, preventing interactions between the metal and the underlying layer, and to improve contact resistance between layers. When a material such as copper or a copper alloy is used for a conductive line, it is often coated with a diffusion preventive film to prevent the copper from diffusing into the underlying layer. The diffusion preventive film may be a high melting point metal such as tungsten or tantalum. Metals such as tungsten or tantalum are often more difficult to machine into various shapes as compared with other metals such as titanium and aluminum. Table 1 shows the approximate modulus of elasticity E (a measure of the stiffness of a material) for a number of metals.

TABLE 1

| Modulus of Elasticity E for selected metals. | | | | | | |
|---|---|---|---|---|---|---|
| Al | Ti | Pt | Ta | Co | Ni | W |
| E (GPa) 70 | 100 | 170 | 190 | 210 | 210 | 410 |

As seen in Table 1, aluminum and titanium have a significantly lower modulus of elasticity E than other metals such as tungsten and tantalum. A higher value of E generally indicates a more stiff material that will be harder to machine. As a result, it is generally more difficult and expensive to form intricate or complex shaped bodies from tungsten and tantalum (and Pt, Ta, Co and Ni) than from aluminum and titanium.

Embodiments of the present invention relate to devices and methods in which a coil having a sputtering surface made of a metal such as tungsten or tantalum is utilized in a sputtering process to obtain a more uniform layer of deposition material. As shown in the embodiment illustrated in FIGS. 1–3, the coil 104 may include a multilayer structure having an outer layer of a refractory metal or high melting point metal such as tungsten or tantalum. The multilayer structure may include an inner region or core region 200 (FIG. 3) of the base metal and an outer layer 202 of refractory metal. In certain embodiments the inner region 200 comprises a core of metal such as titanium or stainless steel and the outer surface 202 comprises a different material such as tungsten or tantalum.

In certain preferred embodiments, the coil 104 has a preformed, multilayer structure that is fabricated outside of the semiconductor processing chamber 100 by a method other than sputtering. Preferably the outer layer is formed over the inner region by a process such as plasma spraying, arc spraying, flame spraying, ion plating, electroplating or chemical vapor deposition (CVD). These processes may be capable of being run on a large production scale so that a large number of coils can be fabricated quickly and efficiently.

Plasma spray, arc spray, flame spray, and electroplating may generally be referred to as atmospheric processes because they do not usually require the use of a vacuum chamber. Ion plating and CVD may be considered vacuum processes because they are generally carried out in a vacuum chamber.

Plasma spray, arc spray and flame spray are all thermal spray techniques in which a material in a form such as, for example, a powder, wire, or rod is fed to a torch or gun and then heated to a temperature close to or above the material's melting point. The resulting material is then accelerated in a gas stream and transported to the surface to be coated.

In a typical plasma spray process, a gas flows between a cathode and a water cooled anode. The most commonly used gas is argon, but other gases such as, for example, nitrogen, hydrogen and helium may be used. An electric arc is initiated between the cathode and anode using a high frequency discharge and then sustained using DC power. The arc ionizes the gas and creates a high pressure gas plasma. The material, usually in a powdered form, is then introduced into the gas stream and is heated and accelerated by the high temperature and high pressure plasma gas stream. If desired the plasma spray process may be carried out in a controlled atmosphere chamber to minimize oxidation of reactive materials.

In a typical arc spray process, the material to be deposited is in the form of two electrically opposed charged wires that are fed together so that a controlled arc occurs at the intersection of the wire tips. The molten material at the tips is atomized and propelled onto the substrate by a stream of compressed air or other gas. The arc spray process generally offers a high deposition rate and is a relatively low cost process.

In a typical flame spray process, a combustible gas is used as a heat source to melt the deposition material, which may be in the form of a rod, wire, or powder being fed into the heat zone. Typical combustible gases used include acetylene, propane, methyl-acetylene-propadiene, hydrogen and oxygen. The flame spray process also provides for a high deposition rate at a relatively low cost.

In a typical electroplating process, metal ions are deposited from an anode source to a cathode workpiece. Direct current is passed between the anode and cathode through an electrolyte which is usually an aqueous solution of acids, bases or salts that conducts electrical current by the movement of metal ions through the solution. Electroplating offers a high deposition rate and high conformability at a relatively low cost.

In a typical CVD process, material is deposited onto a substrate surface by transporting certain gaseous precursors to the surface and causing the precursors to react or decompose at the surface to form a layer on the substrate. The process is usually carried out in a vacuum chamber and the substrate is typically heated. Advantages of CVD include high purity and high conformability. Disadvantages generally include greater expense and a lower deposition rate than those of the thermal spray processes.

In a typical ion plating process, a gas such as argon is introduced into a vacuum chamber which includes a substrate cathode. An electric field is applied to ionize the gas and form a plasma. A source material is vaporized and the vaporized source material passes through the plasma and coats the substrate. Advantages of ion plating include a high deposition rate and formation of a high purity film, but ion plating is relatively expensive when compared to some non-vacuum processes.

In another aspect of embodiments of the present inventions, by forming the coil 104 outside of the semiconductor processing chamber 100 using a process such as those described above, the outer layer may be formed into a thick film if desired, which can be used for numerous sputtering cycles. Targets and coils are often considered consumables, so the ability of the coil to be used for numerous cycles is desirable. For example, in certain applications a barrier layer to be deposited on a workpiece may be sputtered to a thickness of about 10 Angstroms. If the outer layer of the coil is formed to be about 100 $\mu$m, then the coil outer layer may last for thousands of sputtering cycles. In most embodiments the primary source of sputtered material is the target and the coil supplies a relatively small amount of sputtered material to the workpiece. As a result, a thick film of a sputtering material on a coil can have a very long lifetime. Of course the barrier layer thickness and the coil outer layer thickness may be varied as desired. For example, in certain embodiments the coil outer layer thickness may be at least 1 $\mu$m, or about 5 $\mu$m and greater, with a preferred range of up to several mm. One factor that may influence the desired thickness of the coil outer layer is the material of the layer. It may be desirable in certain embodiments to make the layer more thick for a less expensive material (for example, Ti), and less thick for a more expensive material (for example, Ta). Some preferred embodiments include a coil outer layer thickness of at least about 550 $\mu$m. Embodiments may also include a coil outer layer thickness in the range of about 100 $\mu$m to about 1000 $\mu$m, more preferable about 100 $\mu$m to about 600 $\mu$m.

Figure 2:
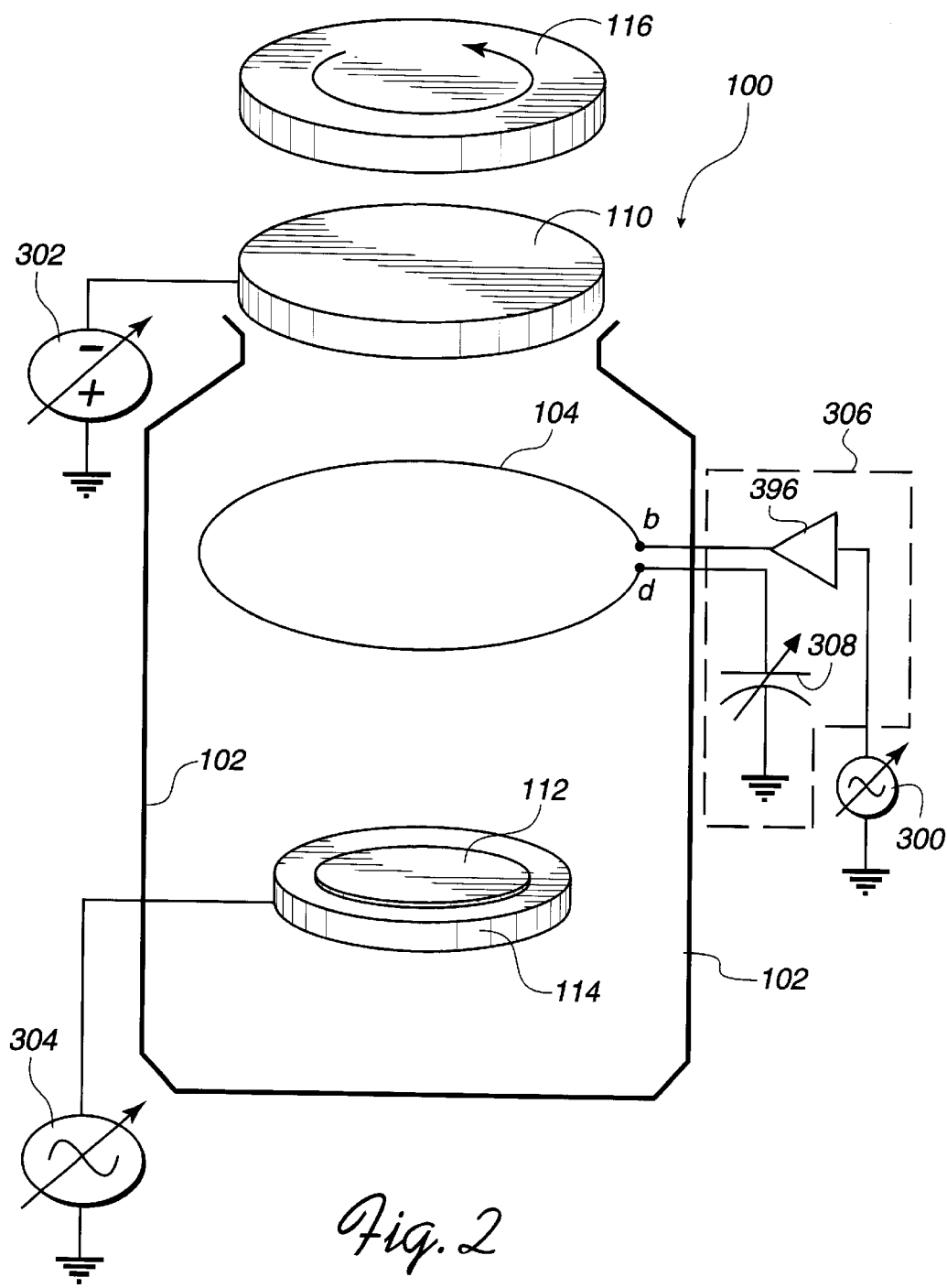
FIG. 2 is a schematic diagram of the electrical interconnections to the plasma generating chamber of FIG. 1.

A multilayer coil 104 formed in accordance with one of the processes described above may be used in a system such as that illustrated in FIGS. 1–2, which show an example of a plasma generator used in accordance with an embodiment of the present inventions. A substantially cylindrical shield 106 partially defines a plasma chamber 100 in a vacuum chamber 102 (represented schematically in FIG. 2). The plasma chamber 100 of this embodiment may utilize a multi-turn coil or a single turn coil 104 which is carried internally of the vacuum chamber walls by the chamber shield 106 which protects the interior walls of the vacuum chamber 102 from the material being deposited within the interior of the plasma chamber 100.

An ion flux strikes a negatively biased target 110 positioned at an upper end of the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote a desired pattern of erosion by sputtering of the target 110.

Radio frequency (RF) energy from an RF generator 300 (FIG. 2) is radiated from the coil 104 into the interior of the plasma chamber 100, which energizes a plasma within the plasma chamber 100. The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate.

FIG. 2 includes a schematic representation of the electrical connections of the plasma generating apparatus of this illustrated embodiment. To sputter target material onto the substrate 112, the target 110 is preferably negatively biased by a variable DC power source 302 to attract the ions generated by the plasma. In the same manner, the pedestal 114 may preferably be negatively biased by a variable RF power source 304 to bias the substrate 112 negatively to attract the ionized deposition material to the substrate 112. In alternative embodiments, the pedestal 114 may be biased by a high frequency AC power source or a DC power source to bias the substrate 112 so as to attract the ionized deposition material more uniformly to the substrate 112. In yet another alternative embodiment, external biasing of the substrate 112 may be omitted.

One end of the coil 104 is coupled to an RF source such as the output of an amplifier 396 and impedance-matching network 306, the input of which is coupled to the RF generator 300. The other end of the coil 104 is coupled to ground, preferably through a capacitor 308, which may be a variable capacitor. The amplifier 396 and impedance-matching network 306 may act to adjust the combined impedances of the RF coil 104 and the network 306 to match the impedance of the RF generator 300 so that RF energy will be efficiently transmitted from the RF generator 300 to the RF coil 104 rather than being reflected back to the generator 300.

Figure 4:
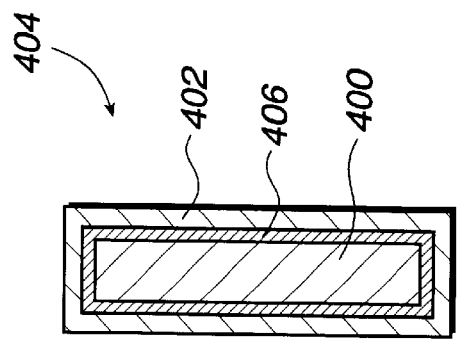
FIG. 4 is a cross-sectional view of a coil having an inner region, a barrier region and an outer layer in accordance with an embodiment of the present invention.

The structure of the coil may vary depending on the materials used and the chamber specifications. FIG. 4 illustrates another embodiment of a coil 404 in which an intermediate layer or barrier layer 406 is formed between the inner region 400 and the outer layer 402. The intermediate layer 406 may operate to increase the adhesion of the outer layer 402 to the inner region 400 and/or may prevent undesirable interactions between the two layers. The intermediate layer 406 may also act to relieve stresses between the inner region 400 and outer layer 402. For example, the intermediate layer 406 may be formed to have a coefficient of thermal expansion that is between those of the inner region 400 and the outer layer 402, to minimize stresses at the interface between layers. Preferably the intermediate layer 406 is formed using one of the techniques described above for forming the outer layer 402. Even more preferably, the same technique is used to form the intermediate layer 406 and the outer layer 402. If desired, more than one intermediate layer may be formed between the inner region 400 and the outer layer 402.

Figure 3:
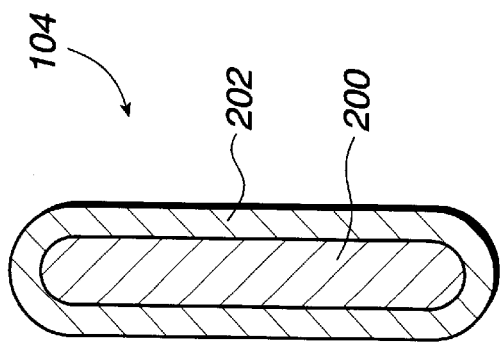
FIG. 3 is a cross-sectional view of a coil having an inner region and an outer layer in accordance with an embodiment of the present invention.

It should be noted that the corners of the coil 404 illustrated in FIG. 4 are sharp, whereas the corners of the coil 104 illustrated in FIG. 3 are smoothed or curved. The coil shape can be modified as desired, and may include a variety of shapes in addition to the generally ribbon shapes of FIGS. 3 and 4.

Figure 5:
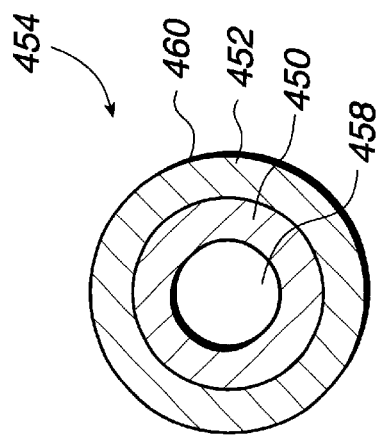
FIG. 5 is a cross-sectional view of a coil having a coolant carrying channel in accordance with an embodiment of the present invention.

FIG. 5 illustrates another embodiment in which a coil 454 includes a coolant carrying channel 458 to facilitate heat transfer from the sputtering surface 460 of the outer layer 452 and the inner layer 450 to prevent the coil 454 from reaching undesirably high temperatures during the sputtering process and prevent thermal cycling. The inner channel 458 permits the flow of a coolant such as water through the coil 454. The water is preferably circulated through the coil 454 in a closed system having a heat exchanger to facilitate heat transfer from the coil 454. The shape of both the coil and the inner channel may be any suitable shape, including circular (as shown in FIG. 5) or any non-circular shape such as, for example, rectangular.

Embodiments of the present invention may utilize a thick layer of refractory metal on the coil that can last for thousands of cycles. Furthermore, because the coil is formed outside of the semiconductor processing chamber, an adhesion film (if desired) can easily be formed on the coil without adversely affecting the workpiece throughput in the semiconductor processing system. Thus, embodiments of the present invention result in a more efficient process with higher throughput.

In the embodiment illustrated in FIG. 1, a single turn coil 104 was used, but, in alternative embodiments, multiple turn coils may be used. Still further, instead of the ribbon shape coil 104 illustrated, a coil having a helix or spiral shape, either with or without a cooling channel therein, could be used. Also, a flat, open-ended annular ring may be used as described in copending application Ser. No. 08/680,335, entitled "Coils for Generating a Plasma and for Sputtering," filed Jul. 10, 1996 and assigned to the assignee of the present application. The coil could also be combined with the shield so that a coil-shield which functions as a multi-turn coil is used. Such a coil-shield is explained in greater detail in copending application Ser. No. 08/730,722, filed Oct. 8, 1996, entitled "Active Shield for Generating a Plasma for Sputtering" by Sergio Edelstein and Anantha Subramani, which is assigned to the assignee of the present application. The coil-shield includes a thin channel extending completely through the wall of the shield 104 in a helix shape so that the resultant coil-shield comprises a continuous strip of conductive material wound in a helix. Each turn or winding of the coil-shield is separated from the adjacent turn by a gap provided by the continuous channel. The overall shape of such a coil-shield is generally cylindrical but other shapes may be used depending upon the application.

A variety of materials may be used for the outer layer of the coil in addition to tungsten and tantalum. Other metals include, but are not limited to Ni, Co, Pt, In, Ru and Ti. Other materials and various alloys of these and other elements may also be used. One example of such an alloy is TiW. The inner region of the coil may also be fabricated from a variety of materials, depending on the application.

Figure 6:
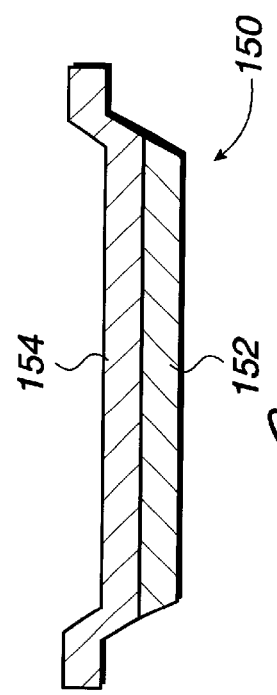
FIG. 6 is a cross-section view of a target in accordance with an embodiment of the present invention.

It may also be desirable to form a target using methods such as those described above for forming the coil. A number of advantages are possible by forming a multilayer target 150 as illustrated, for example, in FIG. 6. By forming the target 150 with a sputtering layer 152 of the desired metal (such as W, Ta, Ni, Co, Pt, In, Ru and Ti, for example) over a base metal layer 154 of a less expensive metal, the cost of the target 150 can be decreased. In addition, in certain embodiments the base metal target layer 154 may be formed from a material that is lighter than the sputtering layer 152 metal, thus saving weight. Examples of relatively light metals include Al and Ti. The base metal layer 154 could also be made from a metal having particular characteristics, such as increased electrical conductivity (Cu), increased thermal conductivity, and the like, to provide certain advantages in electrical or thermal properties when compared with a target fabricated solely from the sputtering material.

Other components in the sputtering system may also be formed using processes such as those described above. Such components may include at least portions of coil support standoffs 120 and coil feedthrough standoffs 124, which may be biased and exposed to the plasma and therefore may be sources of deposition material. Examples of coil support standoffs and coil feedthrough standoffs are described in copending application Serial No. 08/853,024, entitled "Recessed Coil for Generating A Plasma," filed May 8, 1997 by Subramani et al., and assigned to the assignee of the present application. As illustrated in the embodiment of FIG. 1, the coil 104 is carried on the chamber shield 106 by a plurality of coil standoffs 120 which electrically insulate the coil 104 from the supporting chamber shield 106. The insulating coil standoffs 120 preferably have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, preferably has an internal labyrinth structure to prevent the formation of a short between the coil 104 and the wall of the shield. RF power may be applied to the coil 104 by feedthrough bolts. The feedthrough is coupled to the RF generator 300 (shown schematically in FIG. 2) through the coil 104 and the impedance-matching network 306 (also shown schematically in FIG. 2). These portions of 120,124 which are electrically coupled to the coil 104 are likely to sputter material from surfaces exposed to the plasma. Therefore, these components may be formed to have a multilayer structure as described above, with a base metal layer and an outer sputtering layer.

Figure 7:
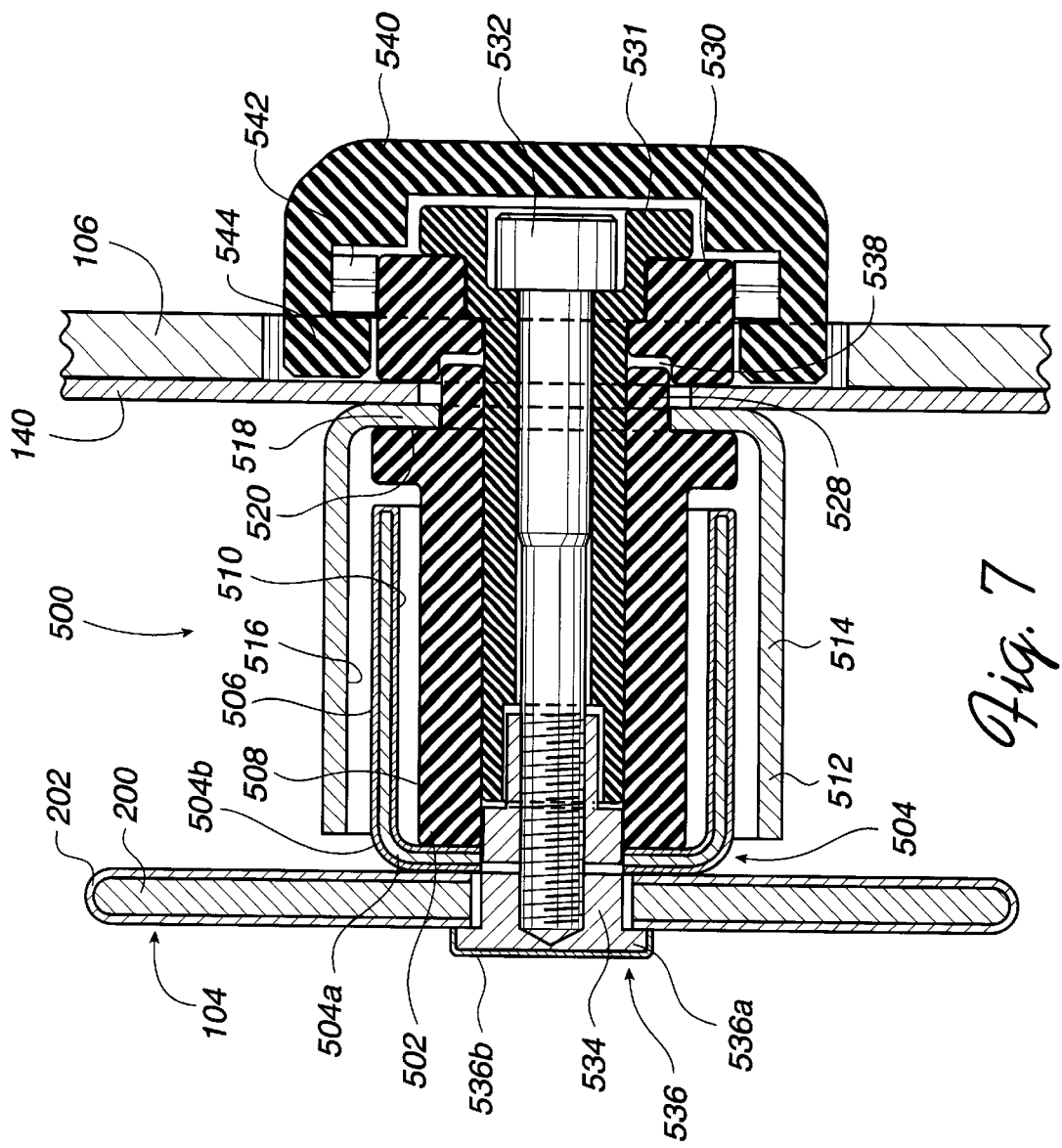
FIG. 7 is a cross-sectional view of a coil standoff in accordance with an embodiment of the present invention.
Figure 9:
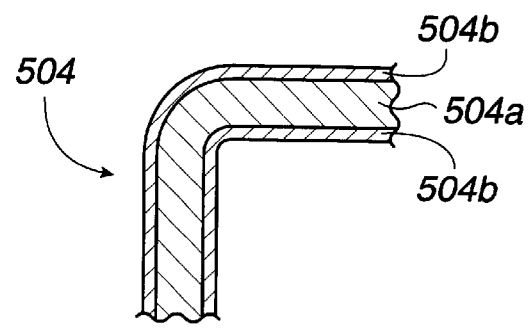
FIG. 9 is a cross-sectional view of a cover portion of the coil support standoff of FIG. 7.

FIG. 7 is a detailed cross-sectional view of a coil support standoff 500 in accordance with another embodiment of the present invention. As illustrated in FIG. 7, the standoff 500 includes a cylindrical insulative base member 502 and a cup-shaped metal cover member 504 having a cylindrically shaped side wall 506 spaced from the lateral side 508 of the base member 502 to form a labyrinth passageway 510 oriented substantially transverse to the wall 140 of the shield 106. The passage way 510 of the standoff 500 of FIG. 7 may suffice in preventing the formation of a path of deposition material across the standoff which could short the coil 104 to the shield 106. The standoff 500 may also include a second cup-shaped metal cover member 512 having a cylindrically shaped side wall 514 spaced from the side 506 of the first cover member 502 to form a second labyrinth passageway 516 oriented generally parallel to the passageway 510 to further reduce the likelihood of the formation of a shorting conductive path. The second cover member 512 has a back wall 518 positioned between a shoulder 520 of the base member 502 and the shield wall 140. The base member shoulder 520 ensures that the second cover member 512 is tightly engaged against and in good electrical contact with the shield wall 104 which is maintained at electrical ground. Accordingly, the second cover member 512, spaced from the first cover member 504, is likewise maintained at ground. On the other hand, the first cover member 504 is tightly engaged against the coil 104. Consequently, the cover member 504 is at the same potential as the coil 104 and hence may sputter. Because the second cover member 512 is at ground potential and is positioned to cover most of the exposed surfaces of the first cover member 504, it is believed that the second cover member can substantially reduce sputtering of the first cover member 504 in those applications in which sputtering of the standoffs is undesirable. However, in those applications where the cover 504 may sputter, the cover 504 may include a multilayer structure formed as described above for the coil 104, which has an inner region 200 and an outer layer 202. FIG. 9 illustrates a magnified cross-sectional view of an upper corner region of the cover 504 of FIG. 7, including the inner layer 504*a* and the outer layer 504*b*.

Figure 10:
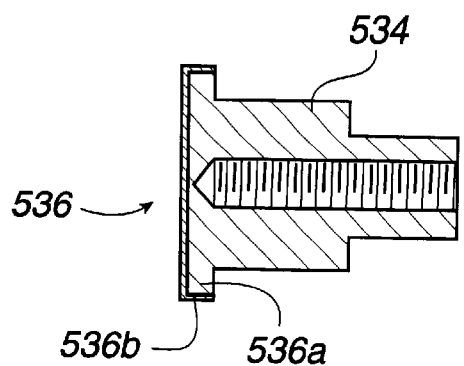
FIG. 10 is a cross sectional view of a nut and flange portion from the coil support standoff of FIG. 7.

The first insulative base member 502 has a collar 528 which extends through an opening in the shield wall 140. The standoff 500 further includes a second insulative base member 530 positioned on the other side of the shield wall 140 from the first insulative base member 502. Seated in a metal sleeve 531 is a bolt 532 which passes through interior openings in the sleeve 531, second insulative base member 530, shield wall 140, second cover member 512, and first insulative base member 502. A nut 534 having a flange 536 passes through openings in the coil 104, first cover member 504 and the first insulative base member 502 and threadably fastens to the bolt 532. The nut flange 536 engages the coil 104 and compresses the assembly of the standoff 500 together to secure the standoff and coil 104 to the shield wall 140. As illustrated in FIG. 10, the nut 534 may have a multilayer structure such as that described above for the coil 104, including a flange 536 having an inner layer 536*a* and an outer layer 536*b*.

The collar 528 of the first insulative base member 502 insulates the metal sleeve 531 and the bolt 532 from the grounded shield wall 140. A space 538 is provided between the collar 528 and the second insulative base member 530 so that the compressive force of the bolt 532 and the nut 534 does not damage the insulative members which may in certain embodiments be made of breakable materials such as ceramics. The end of the bolt 532 may be covered by a third insulative member 540 which, in the illustrated embodiment is button-shaped. The second insulative base member has a flange 542 spaced from the shield wall 140 which receives a lip 544 of the insulative cover member 540 to retain the cover member 540 in place.

Figure 8:
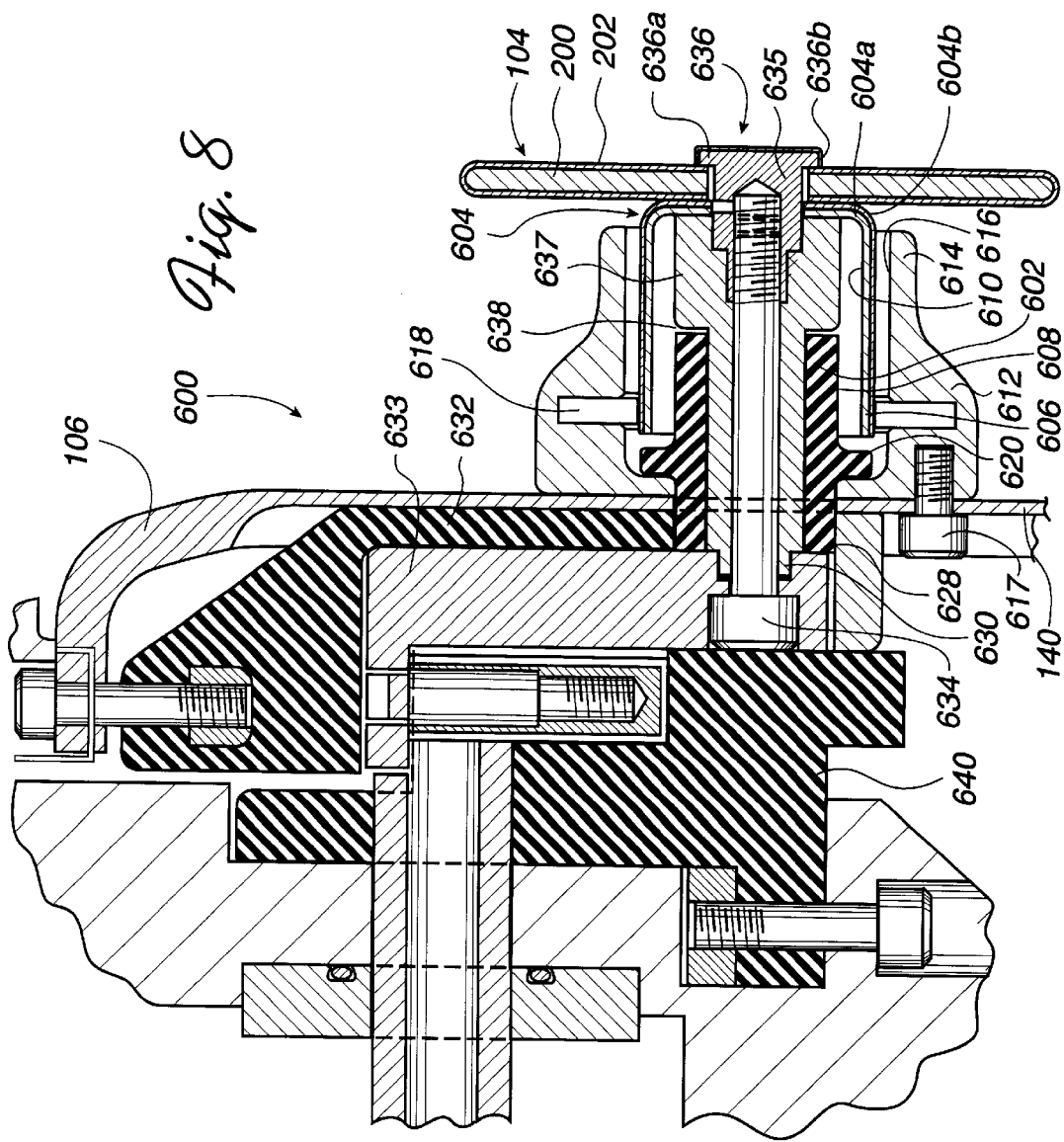
FIG. 8 is a cross-sectional view of a coil feedthrough standoff in accordance with an embodiment of the present invention.
Figure 11:
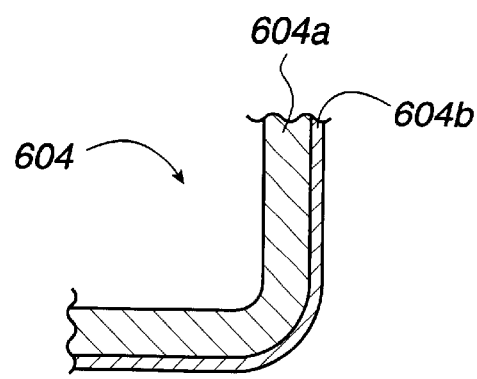
FIG. 11 is a cross-sectional view of a cover portion of the coil feedthrough standoff of FIG. 8.

FIG. 8 is a detailed cross-sectional view of a feedthrough standoff 600 in accordance with another embodiment of the present invention. Like the support standoff 500 of FIG. 7, the feedthrough standoff 600 includes a cylindrical insulative base member 602 and a cup-shaped metal cover member 604 having a cylindrically shaped side wall 606 spaced from the lateral side 608 of the base member 602 to form a labyrinth passageway 610 oriented substantially transverse to the wall 140 of the shield 106. In addition, the standoff 600 of FIG. 8 has a second cup-shaped metal cover member 612 having a cylindrically shaped side wall 614 spaced from the side 606 of the first cover member 604 to form a second labyrinth passageway 616 oriented generally parallel to the passageway 610 to further reduce the likelihood of the formation of a shorting conductive path. As described above for the coil support standoff, the cover member 604 may include a multilayer structure formed as described above for the coil 104. FIG. 11 illustrates a magnified cross-sectional view of a lower corner region of the cover member 604, including inner layer 604*a* and an outer layer 604*b*. It should be noted that the cover member 604 illustrated in FIGS. 8 and 11 includes outer layer 604*b* on one side of inner layer 604*a*; whereas the cover 504 illustrated in FIGS. 7 and 9 includes outer layer 504*b* on the inside and outside of inner layer 504*a*. Depending on the method used for fabricating the component and/or the intended use of the component, the outer layer may be formed on one side of the inner layer, on both sides of the inner layer, or on only a portion of the component. In addition, the component may include one or more intermediate layers such as intermediate layer 406 illustrated in FIG. 4, between the inner layer and outer layer.

The second cover member 612 is fastened to the shield wall 140 by screw fasteners 617 which ensure that the second cover member 612 is tightly engaged against and in good electrical contact with the shield wall 140 and therefore grounded to retard sputtering of the first cover member 604. An annular shaped channel 618 in the second cover member is coupled to the threaded holes for the fasteners 617 to vent gases that might inadvertently be trapped in the fastener holes. A base member shoulder 620 between the end of the first cover member 604 and the second cover member 612 has sufficient clearance so as to avoid stress on the insulative base member 602.

The first insulative base member 602 has a collar 628 which extends through an opening in the shield wall 140. Seated in the insulative base member 602 and the collar 628 is a conductive metal sleeve 630 which passes from one side of the shield wall 140 to the other. The standoff 600 further includes a second insulative base member 632 positioned on the other side of the shield wall 140 from the first insulative base member 602. Seated in the second insulative base member 632 and engaging the end of the sleeve 630 is a conductive metal bar 633. Seated in the conductive metal bar 633 is a bolt 634 which passes through interior openings in the bar 633 and sleeve 630 to the coil side of the shield wall 140. A nut 635 having flange 636 passes through openings in the coil 104, first cover member 604 and the sleeve 630 and threadably fastens to the bolt 634. The nut flange 636 engages the coil 104 and compress the assembly of the standoff 600 together to secure the feedthrough standoff and coil 104 to the shield wall 140. As described above for the coil support standoff, the nut flange 636 may have a multilayer structure 636*a*, 636*b* similar to that of nut flange 536 for the coil support standoff.

The collar 628 of the first insulative base member 602 insulates the metal sleeve 630 and the bolt 634 from the grounded shield wall 140. The second insulative member 632 insulates the conductive bar 633 from the grounded shield wall 140. RF current travels along the surface of the conductive bar 633 from an RF source exterior to the chamber, along the surfaces of the sleeve 630, the first cover member 604 engaging the end of the sleeve to the coil 104 engaging the first cover member 604. The sleeve 630 has a shoulder 637 to retain the first insulative member 602 in place. However, a space 638 is provided between the shoulder 637 and the first insulative base member 604 so that the compressive force of the bolt 634 and the nut 635 does not damage the insulative members which may be made of breakable materials such as ceramics. As set forth above, the conductive bar 633 carrying RF currents from the exterior generator to the feedthrough is seated in a second insulative member 632. Covering the other side of the conductive bar 633 and the end of the bolt 634 is a third insulative member 640. The insulative members 632 and 640 conform around the RF conductive members to fill the available space to avoid leaving spaces larger than a dark space to inhibit formation of a plasma and arcing from the conductive bar 633 and the bolt 634.

Thus, it is seen that portions of the coil support standoff assembly 500 and feedthrough standoff assembly 600, as well as other chamber components, may be particularly suited for fabrication using techniques such as those described earlier for the coil. In particular, the portions of the standoffs 500 and 600 that may be exposed to the plasma and which therefore may serve as deposition material sources may be fabricated to have a multilayer structure such as that of the coil. For the standoff 500, these components may include at least the cup-shaped metal cover members 504 and 512, and the nut 534 having flange 536. For the feedthrough standoff 600, these components may include at least the cup-shaped metal cover members 604 and 612, and the nut 635 having flange 636. Those components exposed to the plasma which are biased will sputter considerably more material than components exposed to the plasma which are at ground. Depending on the exact design of the standoff and feedthrough standoff, other components which might be exposed to the plasma include at least an end portion of the bolts 532 and 634.

It should be recognized that embodiments of the present invention are applicable to plasma chambers having more than one RF powered coil or RF powered shield. For example, the present invention may be applied to multiple coil chambers for launching helicon waves of the type described in copending application Ser. No. 08/559,345, filed Nov. 15, 1995 and entitled "Method And Apparatus For Launching a Helicon Wave in a Plasma."

The appropriate RF generators and matching circuits have components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary. For example, 1 MHz to 20 MHz is believed suitable. An RF power setting of 1.5 kW is preferred but a range of 1.5–5 kW is satisfactory. In addition, a DC power setting for biasing the target 110 of 8–12 kW is preferred but a wider range such as 2–24 kW may also be satisfactory. A pedestal 114 bias voltage of −30 volts DC is also suitable. Values for the above parameters will vary, depending upon the particular application.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–100 mTorr. For ionized PVD, a pressure between 10 and 50 mTorr often provides better ionization of sputtered material.

It will, of course, be understood that modifications of the present invention, in its various aspects, will be apparent to those skilled in the art, some being apparent only after study, others being matters of routine mechanical and electronic design. The term metal as used herein is meant to include metallic materials such as pure metals, alloys of metals, and alloys of metals and other elements. In addition, modifications to the thermal spray, CVD, ion plating and electroplating techniques described above may be made as known in the art. In addition, other industrial processes for forming layers of material on a body may also be used where appropriate.

Other embodiments are also possible, their specific designs depending upon the particular application. A variety components in a sputtering chamber (in addition to the target, coil and feedthroughs) may be sources of sputtering material and can be formed and used according to embodiments of the present invention. As such, the scope of the invention should not be limited by the particular embodiments herein described but should be defined by the claims.

What is claimed is:

1. A method for forming a coil having a sputtering surface, comprising:
   providing a coil comprising an inner core of a first metal material; and
   forming an outer layer having a sputtering surface comprising a second metal material over said inner core using a process selected from the group consisting of plasma spraying, arc spraying, flame spraying, ion plating, chemical vapor deposition and electroplating.

2. A method as in claim 1, further comprising forming an intermediate layer over said inner core and forming said outer layer over said intermediate layer.

3. A method as in claim 2, wherein said intermediate layer is formed to be at least one of an adhesion layer and a stress relief layer.

4. A method as in claim 1, wherein said outer layer is formed using ion plating.

5. A method as in claim 1, wherein said outer layer is formed using electroplating.

6. A method as in claim 1, wherein said outer layer is formed using chemical vapor deposition.

7. A method as in claim 1, wherein said outer layer comprises at least one material selected from the group consisting of Ta, W, Ni, Co, Pt, In, Ru, and TiW.

8. A method as in claim 1, wherein said inner core includes a coolant carrying channel therein.

9. A method as in claim 1, wherein said outer layer is formed using a process selected from the group consisting of plasma spraying, arc spraying, and flame spraying.

10. A method for forming at least one component for use in a plasma sputtering chamber, comprising:
    providing a part comprising a metal;
    forming an intermediate layer over said part;
    forming an outer sputtering layer over said intermediate layer using a process selected from the group consisting of plasma spraying, arc spraying, flame spraying, ion plating, chemical vapor deposition and electroplating;
    wherein said part is formed from a first material, said intermediate layer is formed from a second material, and said outer sputtering layer is formed from a third material, wherein said first, second and third materials are different; and
    wherein said part including said metal, said intermediate layer and said outer sputtering layer comprises a coil.

11. A method as in claim 10, wherein the intermediate layer is formed using a using a process selected from the group consisting of plasma spraying, arc spraying, flame spraying, ion plating, chemical vapor deposition and electroplating.

12. A method as in claim 10, wherein the outer sputtering layer is formed using a process selected from the group consisting of plasma spraying, flame spraying, and arc spraying.

13. A method as in claim 10, wherein the outer sputtering layer is formed using a ion plating process.

14. A method as in claim 10, wherein the outer sputtering layer is formed using a chemical vapor deposition process.

15. A method for forming at least one component for use in a plasma sputtering chamber, comprising:
    providing a part comprising a metal;
    forming an intermediate layer over said part;
    forming an outer sputtering layer over said intermediate layer using a process selected from the group consisting of plasma spraying, arc spraying, flame spraying, ion plating, chemical vapor deposition and electroplating;
    wherein said part is formed from a first material, said intermediate layer is formed from a second material, and said outer sputtering layer is formed from a third material, wherein said first, second and third materials are different; and
    wherein said part including said metal, said intermediate layer and said outer sputtering layer comprises at least a portion of a standoff assembly.

16. A method for forming at least a portion of a standoff assembly for use in a plasma sputtering chamber, comprising:
    providing a base metal part comprising a cup-shaped body;
    forming an intermediate layer over said cup-shaped body; and
    forming an outer sputtering layer over said intermediate layer.

17. An apparatus for sputtering material onto a workpiece, comprising:
    a chamber;
    a target comprising a first metal adapted to be sputtered onto said workpiece;
    a holder for said workpiece;
    a plasma generation area between said target and said holder in said chamber;
    a coil positioned in said chamber and adapted to radiate energy into said plasma generation area and to sputter material onto said workpiece, said coil comprising a preformed multilayer structure comprising a coil outer layer from said first metal and a coil inner region of a second metal; and
    at least one feedthrough standoff assembly adapted to supply energy to said coil and at least one support standoff adapted to support said coil,
    wherein portions of said feedthrough standoff assembly and support standoff assembly exposed to said plasma generation area each have a structure including a standoff outer layer comprising said first metal and a standoff inner layer comprising said second metal, wherein said feedthrough standoff assembly and said support standoff assembly each include at least one cup having a cup outer layer of said first metal and a cup inner layer of said second metal.

18. A method for forming at least one component for use in a plasma sputtering chamber, comprising:
    providing a part comprising a metal;
    forming an intermediate layer over said part;
    forming an outer sputtering layer over said intermediate layer, wherein the outer sputtering layer is formed using an electroplating process; and
    wherein said part is formed from a first material, said intermediate layer is formed from a second material, and said outer sputtering layer is formed from a third material, wherein said first, second, and third materials are different.

19. A method for forming a coil for use in an inductively coupled plasma sputtering chamber, comprising:
   providing a base part, wherein the base part is coil-shaped; and
   forming an outer layer having a sputtering surface over said base part using a deposition process other than sputtering.

20. A method as in claim 19, further comprising forming an intermediate layer over said base part prior to forming said outer layer so that said outer layer is formed over said intermediate layer and said base part.

21. A method as in claim 19, wherein said deposition process is selected from the group consisting of plasma spraying, arc spraying, flame spraying, ion plating, chemical vapor deposition and electroplating.

22. A method as in claim 21, further comprising forming an intermediate layer over said base part and forming said outer layer over said intermediate layer and said base part.

23. A method as in claim 19, wherein said process is selected from the group consisting of plasma spraying, arc spraying and flame spraying.

24. A method as in claim 19, wherein the process is ion plating.

25. A method as in claim 19, wherein the process is chemical vapor deposition.

26. A method as in claim 19, wherein the process is electroplating.

27. A method as in claim 19, wherein the base part includes a channel adapted to carry coolant therein.

28. A method as in claim 19, wherein the outer layer is formed to a thickness of at least 5 $\mu$m.

29. A method as in claim 19, wherein the outer layer is formed to a thickness in the range of 100 $\mu$m to 600 $\mu$m.

30. A method as in claim 19, wherein said outer layer comprises a metal selected from the group consisting of Ti, Ta, W, Ni, Co, Pt, In, Ru, and TiW.

31. A method as in claim 19, wherein said outer layer comprises a material selected from the group consisting of W and Ta.

32. A method as in claim 19, wherein said deposition process is an atmospheric deposition process.

33. A method as in claim 19, wherein said part comprises a first metal and said outer layer comprises a second metal.

34. A method as in claim 33, wherein said first metal comprises a metal selected from the group consisting of Ti, Al and stainless steel.

35. A method as in claim 33, wherein said outer layer comprises a metal selected from the group consisting of Ta and W.

36. A method as in claim 33, wherein said outer layer comprises a metal selected from the group consisting of Ni, Co, Pt and In.

37. A method as in claim 33 wherein said outer layer comprises a refractory metal.

38. A method as in claim 19, wherein said outer layer is formed to an average thickness in the range of 100 $\mu$m to 1000 $\mu$m.

39. A method for forming a component for use in a sputtering chamber comprising:
   providing a base part; and
   forming an outer layer having a sputtering surface over said base part using a deposition process other than sputtering;
   wherein said base part and outer layer comprise a component selected from the group consisting of a portion of a coil feedthrough standoff and a portion of a coil support standoff.

40. A method for forming a component for use in a sputtering chamber comprising:
   providing a base part; wherein the base part is cup-shaped and comprises a portion of a standoff; and
   forming an outer layer having a sputtering surface over said base part using a deposition process other than sputtering.

* * * * *